(12) United States Patent
Fujii et al.

(10) Patent No.: US 7,511,965 B2
(45) Date of Patent: Mar. 31, 2009

(54) CIRCUIT BOARD DEVICE AND MANUFACTURING METHOD THEREOF

(75) Inventors: Takayasu Fujii, Tokyo (JP); Isao Sonoda, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 11/399,482

(22) Filed: Apr. 7, 2006

(65) Prior Publication Data

US 2006/0237224 A1    Oct. 26, 2006

(30) Foreign Application Priority Data

Apr. 20, 2005    (JP)    ............ P2005-122492

(51) Int. Cl.
    *H05K 7/10*    (2006.01)
(52) U.S. Cl. .............. 361/767; 361/760; 361/777; 361/784; 361/803; 174/256; 174/260; 174/261; 174/252; 29/846
(58) Field of Classification Search ........ 361/678, 361/690, 709, 720, 767, 774, 808, 760, 748, 361/777, 784, 803; 438/106; 257/698; 174/250, 174/256, 260, 261, 252; 29/830, 846
See application file for complete search history.

(56) References Cited

U.S. PATENT DOCUMENTS

| | | | | |
|---|---|---|---|---|
| 4,363,076 A * | 12/1982 | McIver | ............ | 361/718 |
| 4,682,270 A * | 7/1987 | Whitehead et al. | ........ | 361/764 |
| 5,300,815 A * | 4/1994 | Rostoker | ............ | 257/786 |
| 5,638,597 A * | 6/1997 | Cutting et al. | ............ | 29/830 |
| 5,748,450 A * | 5/1998 | Kim et al. | ............ | 361/777 |
| 5,872,051 A * | 2/1999 | Fallon et al. | ............ | 438/616 |
| 5,936,309 A * | 8/1999 | Kim | ............ | 257/779 |
| 6,165,855 A * | 12/2000 | Besser et al. | ............ | 438/612 |
| 6,165,885 A * | 12/2000 | Gaynes et al. | ............ | 438/612 |
| 6,285,560 B1 * | 9/2001 | Lyne | ............ | 361/760 |
| 6,294,840 B1 * | 9/2001 | McCormick | ............ | 257/778 |
| 6,521,997 B1 * | 2/2003 | Huang et al. | ............ | 257/737 |
| 6,833,615 B2 * | 12/2004 | Geng et al. | ............ | 257/698 |
| 7,000,312 B2 * | 2/2006 | Fukunabe et al. | ............ | 29/843 |
| 2002/0125043 A1 * | 9/2002 | Yoshida | ............ | 174/261 |
| 2002/0192859 A1 * | 12/2002 | Akram | ............ | 438/106 |
| 2003/0117784 A1 * | 6/2003 | Fukunabe et al. | ............ | 361/760 |

(Continued)

FOREIGN PATENT DOCUMENTS

JP    2000-68637 A    3/2000

*Primary Examiner*—Dean A. Reichard
*Assistant Examiner*—Xiaoliang Chen
(74) *Attorney, Agent, or Firm*—Sughrue Mion, PLLC (57) ABSTRACT

In a circuit board device having an electronic component mounted on an electrode land on a board by reflow soldering, voids that adversely affect the solder joint in various ways are prevented from forming. The electrode land corresponding to a component electrode for the electronic component is divided into a plurality of land regions by solder resist having a prescribed width. The component electrode is laid above the solder resist so as to form a clearance communicating with the outside of the component electrode, so that gas generated by vaporization of a flux component contained in the solder during reflow-heating is passed through the clearances and let out of the component electrode. In this way, voids in the solder part can more readily be prevented from forming without increasing the number of person hours as compared to the conventional method.

13 Claims, 4 Drawing Sheets

U.S. PATENT DOCUMENTS

| | | | |
|---|---|---|---|
| 2003/0184986 A1* | 10/2003 | Soga et al. | 361/767 |
| 2004/0000428 A1* | 1/2004 | Lii et al. | 174/260 |
| 2004/0038471 A1* | 2/2004 | Sakamoto et al. | 438/200 |
| 2004/0166608 A1* | 8/2004 | Nakamura | 438/118 |
| 2006/0033210 A1* | 2/2006 | Chauhan et al. | 257/737 |
| 2006/0249303 A1* | 11/2006 | Johnson et al. | 174/261 |

* cited by examiner

CIRCUIT BOARD DEVICE AND MANUFACTURING METHOD THEREOF

BACKGROUND OF THE INVENTION

1. Field of the Invention

The present invention relates generally to a circuit board device and a manufacturing method thereof, and more particularly, a technique of preventing voids from forming in the solder joint between an electronic component and a circuit board when the electronic component is mounted by reflow soldering.

2. Description of the Related Art

When an electrical component is mounted on a board by reflow soldering in the manufacture of a circuit board device according to a conventional method, solder paste is applied on an electrode land formed on the board by screen printing or the like, and then the electrode land is provided with a component electrode for the electrical component thereon. Then, reflow heating is carried out to solder the component electrode and the electrode land. According to the conventional method, a flux component contained in the solder paste is vaporized into gas during the reflow heating, and the gas does not completely escape outside and forms voids in the soldered joint. For an electrical component having a relatively large soldering area, in particular, it is not easy to let out the gas generated during the reflow heating, so that large voids are generated in the soldered joint between the component electrode and the electrode land.

As a technique of preventing voids from being left in the solder joint, Japanese Patent Application Laid-Open No. 2000-68637A proposes a method of soldering including providing, on the solder paste, two kinds of solder chips having different melting points both beyond the melting point of the solder in the solder paste and thicknesses larger than that of the solder paste, and carrying out reflow heating as an electronic component (power transistor) is supported on both sides. According to the method, gas generated in the solder paste having the lowest melting point is let out from a space secured by the solder chips, then one solder chip having the lower melting point among the two solder chips melts, and then the other solder chip melts, so that the electronic component is in contact with a melt solder surface while it is inclined. According to the disclosure, the gas is removed and does not remain as voids in the solder joint.

As described above, in the manufacture of the circuit board device, when voids are generated at the time of mounting an electrical component to the board by reflow soldering, the solder joint cannot have sufficient mechanical strength. In addition, a crack can be generated in the solder joint because of the void, and the joint strength can be lowered as the crack extends. This is attributable to a reduction in the electrical characteristic of the electrical component. Furthermore, the thermal resistance at the solder joint increases by the presence of the voids, which degrades the heat radiation characteristic of the electrical component and increases the temperature. This eventually breaks down the electrical component.

While the method of soldering an electronic component disclosed by Japanese Patent Application Laid-Open No. 2000-68637A is effective against gas generated from the solder paste that melts first, gas generated from the solder chip that melts last is trapped between the electronic component and the previously melt solder paste and could still remain as voids. In other words, the method would not be extremely effective in preventing voids from forming. The use of the solder paste and the two kinds of solder chips having different melting points increases the number of kinds of solder or the application amount of the solder, and an adhesive is used to fix the solder chips, which can increase the cost of the joint materials. Using the three kinds of solder having different melting points, it takes longer to apply the solder, and the quality of the solder must be controlled. This is inefficient and disadvantageous in terms of productivity.

SUMMARY OF THE INVENTION

The present invention is directed to a solution to the above-described disadvantages and it is an object of the invention to provide a highly reliable circuit board device that allows voids adversely affecting the solder joint in various ways to be prevented from forming and a method of manufacturing such a circuit board device.

A circuit board device according to the invention includes a circuit board having an electrode land formed thereon, and an electrical component having a component electrode soldered to the electrode land. In the circuit board device, the electrode land including a plurality of land regions divided by solder resist, the solder resist has a prescribed width and is disposed between the land resions. The component electrode is electrically and mechanically connected to each of the land regions by solder provided in each of the land regions, and the component electrode is laid above the solder resist so as to form a clearance comminicating with the outside of the component electrode between the solder resist and the component electrode.

A method of manufacturing a circuit board device including a circuit board having an electrode land formed thereon and an electrical component having a component electrode soldered to the electrode land, according to the invention includes a first, a second, and a third steps. The first step is for preparing a circuit board having an electrode land corresponding to a component electrode, the electrode land is divided into a plurality of land regions by solder resist, and the solder resist has a prescribed width and a prescribed thickness disposed between the land regions ob the circuit board. The second step is for supplying solder paste having a height larger than the thickness of the solder resist on each of the land regions. The third step is for providing the component electrode on the electrode land, carrying out reflow heating, melting and then solidifying the solder paste while keeping a clearance to be left between the solder resist and the component electrode, and thereby electrically and mechanically connecting the component electrode to each of the land regions.

In the circuit board device according to the invention, the electrode land includes a plurality of land regions divided by solder resist, and the component electrode is laid above the solder resist so as to form the clearance communicating with the outside of the component electrode between the solder resist and the component electrode. Therefore, gas generated by vaporization of a flux component contained in the solder during reflow heating is let out of the component electrode through the clearances. In this way, voids can be prevented from forming in the solder joint.

The presence of the clearance communicating with the outside of the component electrode between the component electrode and the electrode land in the solder joint can prevent voids from forming, so that heat generated from the electrical component can efficiently be transmitted to the board. Therefore, the heat radiation characteristic of the electrical component can be improved. In addition, since the electrode land includes a plurality of land regions by the solder resist, a crack forming in the solder joint can be kept from further extending. Consequently, the electrical component can be mounted to the circuit board device with high reliability and good mechanical and electrical connection.

Furthermore, by the method of manufacturing a circuit board device according to the invention, the solder paste having a height larger than the thickness of the solder resist is supplied on each of the land regions, the component electrode is then provided on the electrode land, reflow heating is carried out, the solder paste is melted and then solidified while a clearance is kept to be left between the solder resist and the component electrode. In this way, the component electrode is connected to each of the land regions electrically and mechanically. Therefore, voids can readily be prevented from forming without lowering the operability and connection reliability and without increasing the number of person hours as compared to the conventional method.

BRIEF DESCRIPTION OF THE DRAWINGS

FIGS. 3(a) to 3(d) are sectional views for use in illustrating a method of manufacturing the circuit board device according to the first embodiment;

DETAILED DESCRIPTION OF THE PREFERRED EMBODIMENTS

First Embodiment

Figure 1:
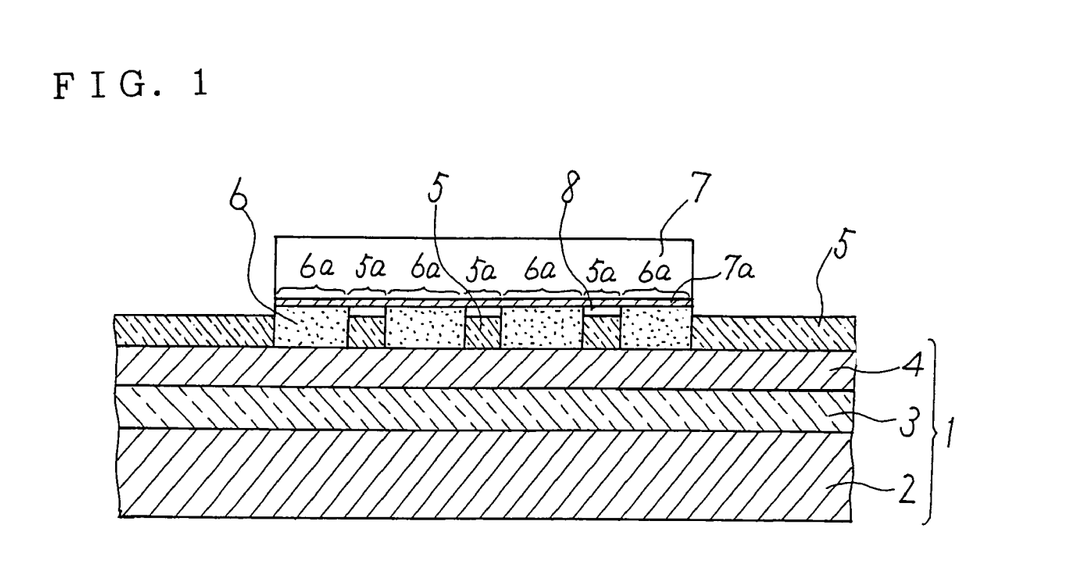
FIG. 1 is a sectional view of the mounting structure of a circuit board device according to a first embodiment of the invention.

Now, a circuit board device according to an embodiment of the invention will be described in conjunction with the accompanying drawings. FIG. 1 is a sectional view of the mounting structure of the circuit board device according to the first embodiment of the invention. An electronic component 7 as an electrical component to be mounted on the circuit board 1 (hereinafter simply as "board 1") is a power transistor such as a MOSFET having a relatively large soldering area for a component electrode 7a. Note that the invention is also effectively applied to other kinds of electrical components having a relatively large soldering area, for example to an electronic component such as a diode.

The board 1 is a metal substrate including an aluminum plate 2 containing aluminum as a core, an insulating layer 3 formed thereon, and an electrode land 4 formed on the entire surface of the insulating layer 3 in a solid pattern. The electrode land 4 is made of Cu, Au, Ag, or the like, and formed by plating or thick-film printing. Note that the metal substrate is used as the board 1 according to the embodiment, but the invention may be applied to a circuit board device having a ceramic board such as alumina or a circuit board such as a printed board.

Solder resist 5 patterned to have an opening corresponding to the range of the component electrode 7a for the electronic component 7 is formed on the electrode land 4. More specifically, the solder resist 5 is patterned so as to expose a prescribed portion of the electrode land 4 through the opening of the solder resist 5. The solder resist 5 is made of solder resist ink containing epoxy resin as a main constituent and is provided as a coating so that the solder does not stick to unintended areas when the electronic component or the like is soldered to the board. Such resist has generally been used according to conventional methods. However, according to the embodiment, the electrode land 4 corresponding to the component electrode 7a for the electronic component 7 is divided into a plurality of land regions 4a by the solder resist 5. The solder resist 5 has a prescribed width and a prescribed thickness and disposed between land regions 4a on the electrode land 4.

Figure 2:
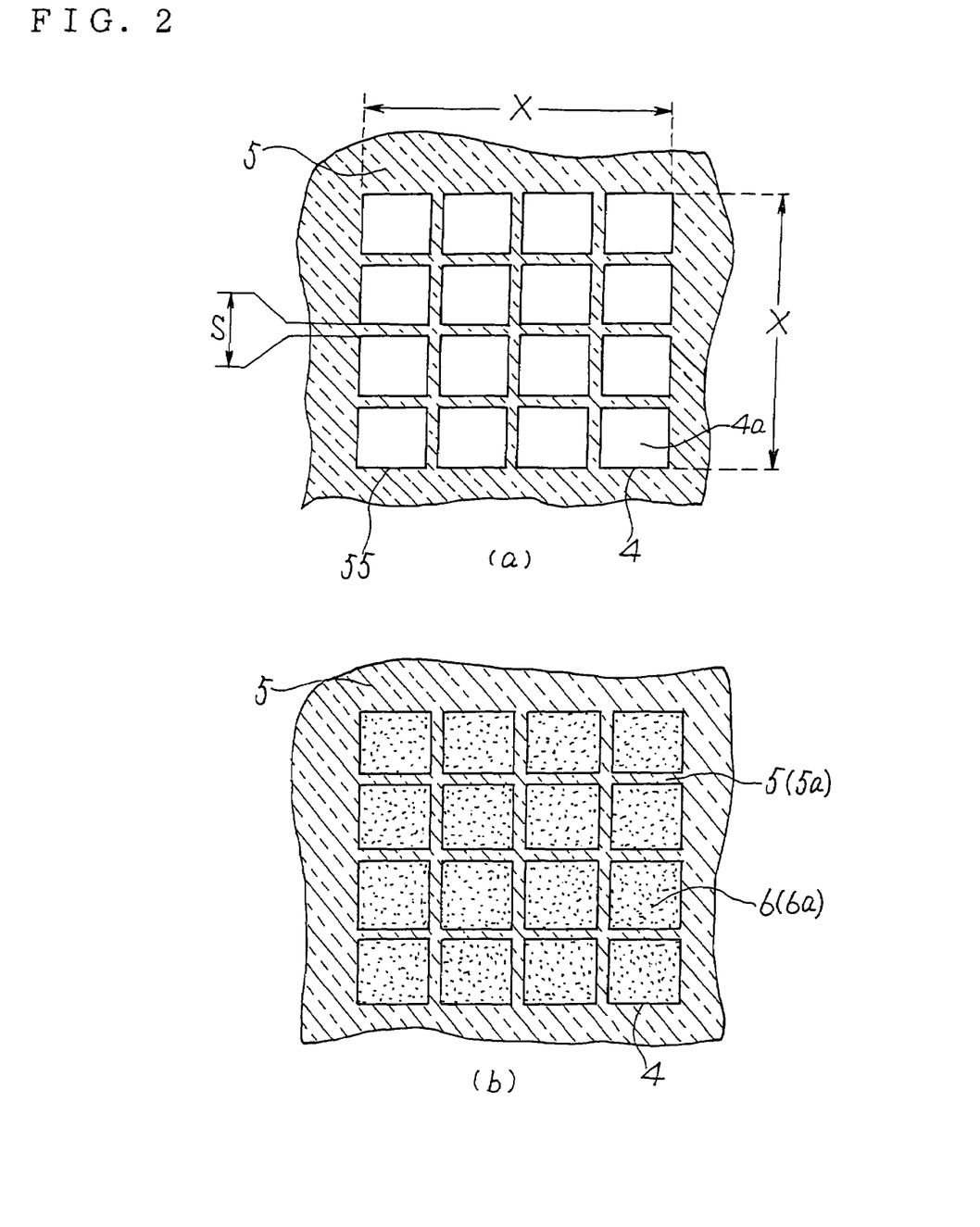
FIGS. 2(a) and 2(b) are top views for use in illustrating an electrode land divided structure according to the first embodiment.

The divided structure of the electrode land 4 according to the embodiment will be described with reference to FIGS. 2(a) to 2(c). According to the embodiment, as shown in FIG. 2(a), the electrode land 4 is divided into 16 land regions 4a by the solder resist 5 having a prescribed width S. The length X of each side of the substantially square electrode land 4 is 10 (mm) for example, and the width S of the solder resist 5 is 0.3 (mm) for example. The width S of the solder resist 5 dividing the electrode land 4 is preferably not more than 20% of the entire area of the electrode land 4 corresponding to the component electrode 7a. If the area occupied by the solder resist 5 is more than 20 (%), the void ratio including the solder resist 5 is more than 20 (%), which reduces the advantage brought about by the invention.

More typically, when the substantially square electrode land 4 whose side length X is 10 (mm) is divided into 16 regions, and the width S of the solder resist is 0.3 (mm), the area occupied by the solder resist 5 in the entire electrode land 4 is approximately 17 (%), and the solder resist 5 does not affect mechanical and electrical connection at the solder joint. However, when the width S of the solder resist 5 is 0.4 (mm), the area occupied by the solder resist 5 is approximately 23 (%), which can affect mechanical and electrical connection at the solder joint and is not preferable.

As shown in FIG. 2(b), on each of the land regions 4a produced by dividing, solder 6 is formed to have the same shape as that of the land region 4a. In this way, the component electrode 7a for the electronic component 7 and the land regions 4a are mechanically and electrically connected through the solder 6. However, according to the embodiment, the electrode land 4 is divided into the 16 regions by the solder resist 5, so that the part of the solder resist 5 between the land regions 4a are not soldered. More specifically, as shown in FIG. 1, when viewed in a section of the solder joint between the component electrode 7a and the electrode land 4, the solder joints 6a and non-joint parts 5a by the solder resist 5 are regularly arranged, and the component electrode 7a is laid on the solder joints 6a and above the solder resist 5, therfore, clearance 8 is formed between the component electrode 7a and the solder resist 5 at the non-joint part 5a.

Figure 3:
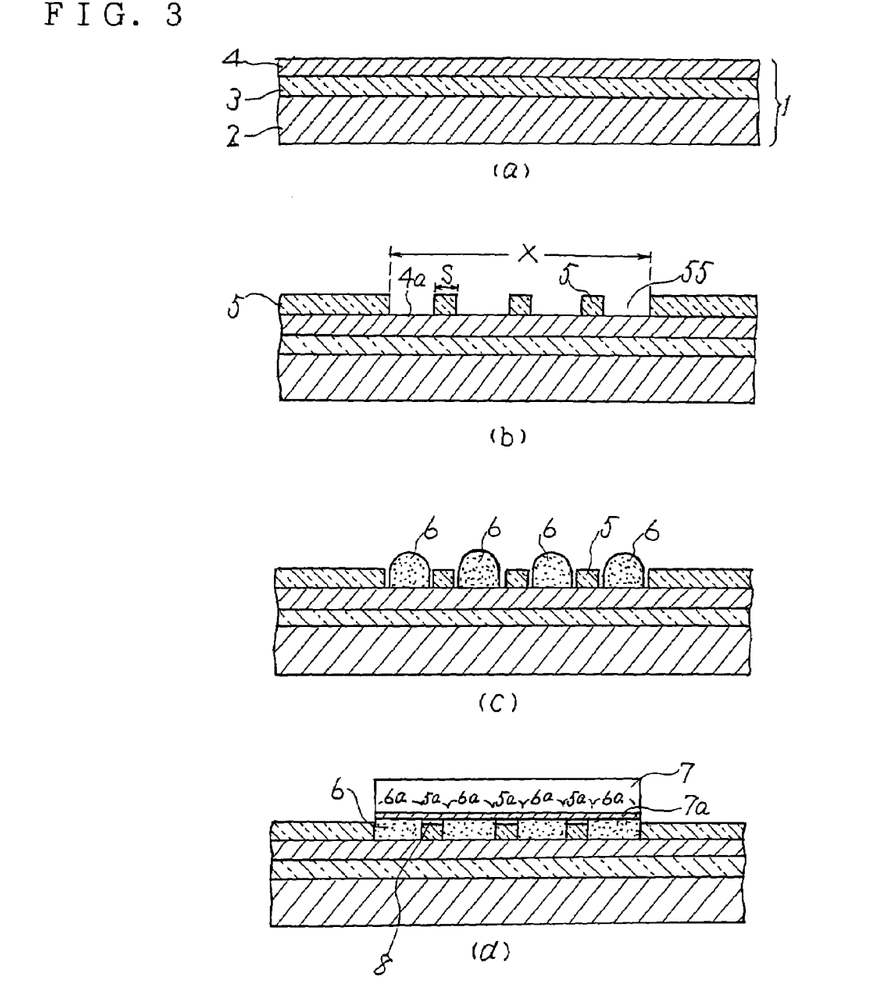

A method of manufacturing a circuit board device according to the embodiment will be described with reference to FIGS. 3(a) to 3(d). As shown in FIG. 3(a), the board 1 on which the electronic component 7 is to be mounted includes an aluminum plate 2, an insulating layer 3 formed thereon, and an electrode land 4 formed on the entire surface of the insulating layer 3 in a solid pattern. As shown in FIG. 3(b), solder resist ink is applied on the board 1 by screen printing and cured by UV irradiation, so that solder resist 5 is formed. The solder resist 5 has a thickness in the range from 20 (ìm) to 30 (ìm) when it is formed.

The part of the solder resist 5 corresponding to the component electrode 7a for the electronic component 7 is an opening 5s, through which the electrode land 4 is partially exposed. FIG. 2(a) corresponds to FIG. 3(b) viewed from the top, and the substantially square electrode land 4 whose side length is X is divided into 16 land regions 4a by the solder resist 5 having a width of S (16 sections). By the process described above, the board 1 having the electrode land 4 corresponding to the component electrode 7a for the electronic component 7 is prepared. The electrode land 4 is divided to the 16 land regions 4a produced by the solder resist 5 having the prescribed width S (first step).

Now, as shown in FIG. 3(c), solder 6 having a height larger than the thickness of the solder resist 5 is applied on the land regions 4a exposed through the opening 5s of the solder resist 5 by screen printing (second step). Note that the solder 6 may be supplied by a dispensing method. The solder 6 used in this case is for example lead-free solder such as Sn—Ag—Cu based solder and Sn—Ag-based solder or lead containing eutectic solder such as Sn—Pb based solder. The solder 6 is supplied in the state of solder paste. The solder 6 is applied substantially in the same pattern as that of the 16 land regions 4a divided by the solder resist 5, and the pattern is as shown in FIG. 2(b) when viewed from the top.

The quantity of the solder 6 supplied in this example is set so that the solder 6 after melting has a height larger than the thickness of the solder resist 5. According to the embodiment, the thickness of the solder is 300 (im) for example, as it is applied on the land regions 4a on the board 1 and about 100 (im) after it is subjected to reflow heating. Meanwhile, the thickness of the solder resist 5 is in the range from 20 (im) to 30 (im) when it is formed. In this way, the height of the solder 6 is formed to be higher than the thickness of the solder resist 5 in order to form a clearance 8 between the solder resist 5 and the component electrode 7a after soldering the component electrode 7a to each of the land regions 4a, so that the clearance 8 let gas escape therethrough and voids can be prevented from forming.

The component electrode 7a is provided on the land regions 4a onwhich solder 6 applied in the electrode land 4, followed by reflow heating, and the solder 6 is melted and then solidified as the solder joints 6a while keeping the clearance 8 to be left between the solder resist 5 and the component electrode 7a at the non-joint part 5a. In this way, the component electrode 7a is electrically and mechanically connected to the land regions 4a. By the process, the circuit board device having the mounting structure as shown in FIG. 3(d) is completed (third step).

In the third step, the solder 6 applied on the land regions 4a is controlled in quantity so that the solder 6 does not leak or expand out of the land regions 4a when it is melted by reflow but remain within the land regions 4a. The quantity of the solder 6 is equal among all the land regions 4a, so that the solder 6 is kept constant in height. In this way, the joining strength of the solder joints 6a on the land regions 4a divided into the 16 sections can be kept equal.

Figure 4:
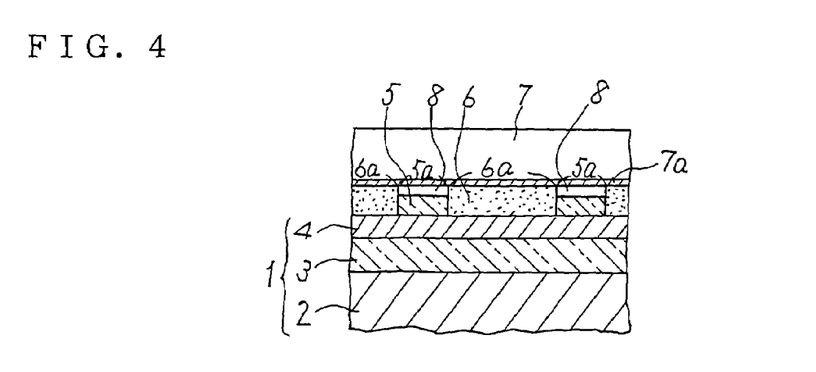
FIG. 4 is an enlarged sectional view of a solder joint in the circuit board device according to the first embodiment.

FIG. 4 is an enlarged sectional view of the solder joint in the circuit board device produced according to the manufacturing method described above. The clearance 8 communicates with the outside of the component electrode 7a, the clealance 8 is formed between the solder resist 5 and the component electrode 7a to form the non-joint part 5a. In this mounting structure, gas generated by vaporization of a flux component contained in the solder 6 during the reflow heating is let out of the component electrode 7a through the clearance 8.

Figure 5:
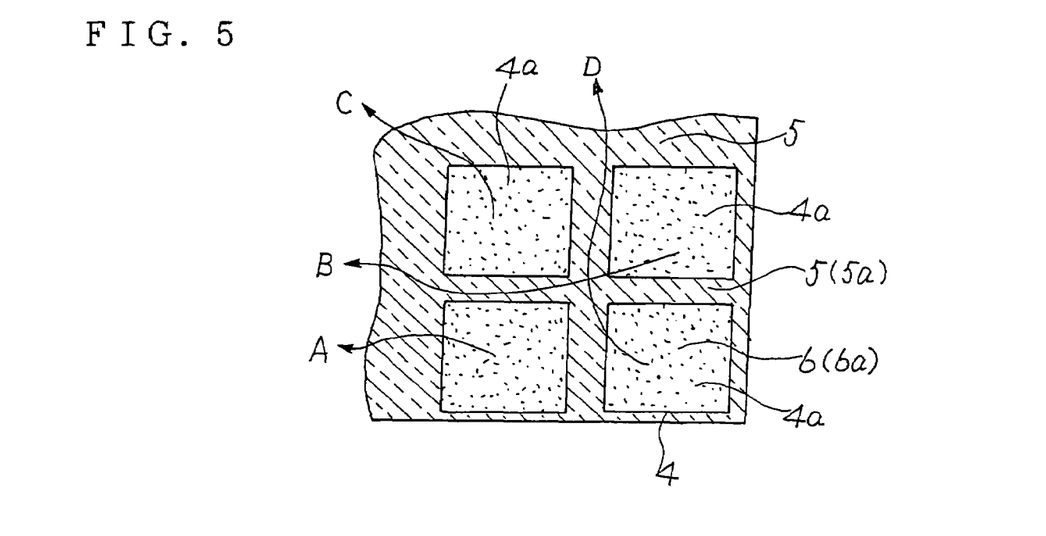
FIG. 5 is a view for use in illustrating exhaust paths for gas generated from the solder joint in the circuit board device according to the first embodiment.

FIG. 5 shows an example of exhaust paths for gas generated in the solder joint 6a between the electrode land 4 and the component electrode 7a. The gas generated by the reflow heating passes through the clearance 8 between the solder resist 5 and the component electrode 7a at non-joint part 5a along paths denoted by the arrows A, B, C, and D in FIG. 5, and is diffused out of the component electrode 7a. In this way, voids can be prevented from forming in the solder joints 6a.

Note that according to the embodiment, at the non joint part 5a, the clearance 8 on the solder resist 5 disposed between the land regions 4a makes the state in which the component electrode 7a is not mechanically or electrically connected to the electrode land 4, partially. Therefore, the part of the solder resist 5 disposed between the land regions 4a may be treated as if it has voids, and the area of the solder resist 5 is included in the count of the void ratio. According to the conventional method, voids are formed entirely in the solder joint, and the void ratio is in the range from 20 (%) to 50 (%).

Meanwhile, according to the embodiment, when the solder resist 5 disposed between the land regions 4a is included as voids and the void ratio is measured, the void ratio is 18 (%) in average and 26 (%) in maximum. Note that the area occupied by the solder resist 5 in the electrode land 4 is approximately 17 (%), and therefore by the method of manufacturing the circuit board device according to the embodiment, it is clear that no or very few voids are generated in the solder joint, and soldering can constantly be carried out with high reliability.

In the mounting structure of the circuit board device according to the embodiment, voids can be prevented from forming, and therefore heat generated from the electronic component 7 can efficiently be transmitted to the board 1 through the solder joints 6, which improves the heat radiation characteristic of the electronic component 7. On the other hand, if voids exist in the solder joint, thermal resistance increases, and the heat radiation characteristic of the electronic component is degraded.

Figure 6:
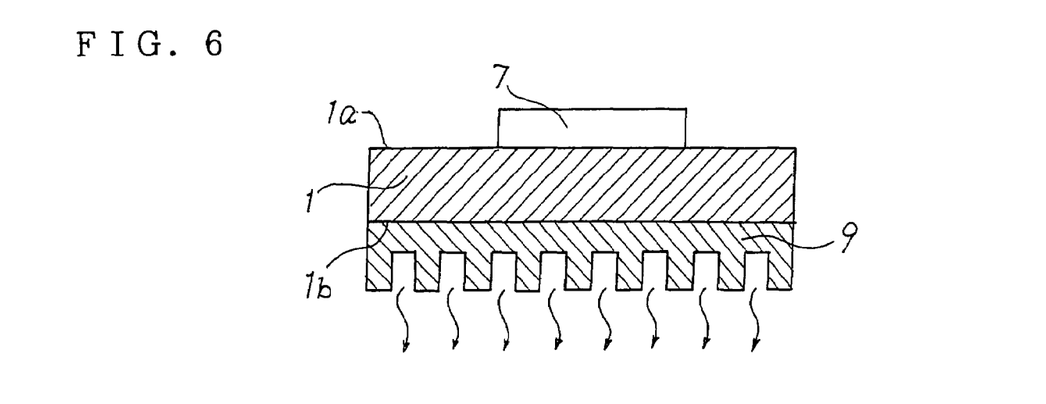
FIG. 6 is a sectional view of heat radiation structure for the circuit board device according to the first embodiment.

Furthermore, as shown in FIG. 6, one surface of the board 1 may have the electronic component 7 placed thereon (referred to as "front surface 1a"), and the other opposite surface ("back surface 1b") may have a heat radiation function. In other words, one side heat radiation board may be employed. The heat generated from the electronic component 7 is transmitted to the board 1 through the solder joint (not shown), then to a heat sink 9 joined to the back surface 1b of the board 1, and then to the atmosphere from the heat sink 9. In this way, the electronic component 7 can be prevented from being broken down by the heat.

Figure 7:
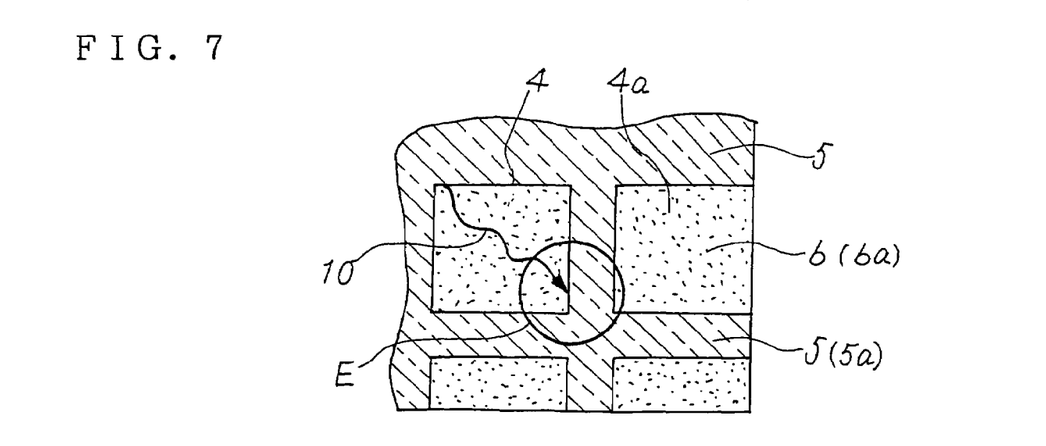
FIG. 7 is a view for use in illustrating the advantage of the circuit board device according to the first embodiment.

In addition, according to the embodiment, even if the solder joint 6a has damages such as a crack 10 by the effect of the temperature cycle or vibration, the solder resist 5 that divides the electrode land 4 as shown in FIG. 7 can prevent the crack 10 from further extending. The crack 10 is generally generated at the outer peripheral part of the solder joint 6a having larger distortion caused by the temperature cycle and the like and then extends toward the inner side. According to the embodiment, however, the solder resist 5 dividing the electrode land 4 stops the expansion of the crack 10 at the location E in the figure, and therefore the crack remains within the area of the land regions 4a. More specifically, in the mounting structure according to the embodiment, the crack 10 generated in the solder joint 6a can be prevented from extending, so that a good characteristic can be provided in terms of mechanical and electrical connection.

According to the embodiment, the substantially square electrode land 4 is divided by the solder resist 5 into the 16 land regions 4a arranged in a lattice pattern by way of illustration, while it goes without saying that there may be various other methods of dividing the land. As long as a path (clearance 8) for letting gas generated by reflow heating during soldering out of the component electrode 7a is secured, the pattern may be for example a radial or stripe shaped pattern other than the described lattice pattern.

In the case, the area of the solder resist 5 occupied in the entire electrode land 4 is preferably in the range unaffecting the state of mechanical and electrical connection (20 (%) or less). According to the embodiment, the entire lower surface of the electronic component 7 serves as the component electrode 7a by way of illustration while the invention is also applicable to an electrical component in which the main body and the component electrode are apart (such as the case in which they are connected by a strip shaped lead).

As in the foregoing, according to the embodiment, in the circuit board device in which the component electrode 7a for the electronic component 7 is soldered on an electrode land 4 formed on the board 1, and the electronic component 7 is mounted on the board 1, the electrode land 4 is divided into a plurality of land regions 4a by solder resist 5 having a prescribed width, and there is the clearance 8 communicating with the outside of the component electrode 7a between the component electrode 7a and the solder resist 5 disposed between the land regions 4a. Therefore, gas generated by vaporization of a flux component included in the solder 6 during reflow heating is exhausted outside through the clearance 8. In this way, voids can be prevented from forming in the solder joints 6a.

Furthermore, by the method of manufacturing the circuit board device according to the embodiment, voids can readily be prevented from forming without lowering the operability and connection reliability and without increasing the number of person hours as compared to the conventional method.

As the clearance 8 communicating with the outside of the component electrode 7a are provided between the component electrode 7a and the solder resist 5 disposed between the land regions 4a, voids can be prevented from forming, and heat generated from the electronic component 7 can efficiently be transmitted to the board 1. Therefore, the heat radiation characteristic of the electronic component 7 can be improved. The back surface 1b of the board 1 has a heat radiation function, and therefore the heat radiation characteristic is even more improved, so that the electronic component 7 can be prevented from being broken down by heat.

The solder resist 5 dividing the electrode land 4 can keep the crack 10 generated in the solder joint 6a from extending, and therefore an even better characteristic in terms of mechanical and electrical connection can be provided.

The invention is applicable to a circuit board device having thereon an electronic component such as a power transistor such as a MOSFET and a diode that requires a relatively large soldering area for the component electrode.

What is claimed is:

1. A circuit board device comprising a circuit board having an electrode land formed thereon, and an electrical component having a component electrode connected to the electrode land, wherein
    the electrode land has a predetermined area and the component electrode is disposed so as to cover the predetermined area of the electrode land,
    a surface of the predetermined area of the electrode land including at least two land regions divided by a solder resist, the solder resist has a prescribed width and is disposed between the at least two land regions on the surface of the predetermined area of the electrode land,
    the component electrode is electrically and mechanically connected to each of the land regions by solder disposed on each of the land regions, and
    the component electrode is laid above the solder resist so as to form a clearance communicating with the outside of the component electrode between the solder resist and the component electrode.

2. The circuit board device according to claim 1, wherein the area of the solder resist dividing the predetermined area of said electrode land is at most 20% of the entire area of the predetermined area of the electrode land.

3. The circuit board device according to claim 1, wherein a surface of said circuit board opposite to the surface of the predetermined area having said electrical component mounted thereon has a heat radiation function.

4. The circuit board device according to claim 1, wherein solder soldering the component electrode to the predetermined area of the electrode land is disposed between the component electrode and each of the land regions, and the clearance is formed between the component electrode and the solder resist.

5. The circuit board device according to claim 1, wherein solder soldering the component electrode is disposed solely below the component electrode.

6. The circuit board device according to claim 1, wherein the solder resist is extended from one peripheral portion of the predetermined area of the electrode land to another peripheral portion thereof.

7. The circuit board device according to claim 1, wherein the solder resist has a lattice pattern to form a plurality of the land regions in the predetermined area of the electrode land.

8. A method of manufacturing a circuit board device including a circuit board having an electrode land formed thereon, and an electrical component having a component electrode connected to the electrode land, wherein the electrode land has a predetermined area and the component electrode is disposed as so to cover the predetermined area of the electrode land, the method comprising:
    preparing the circuit board having the predetermined area of the electrode land corresponding to the component electrode, a surface of the predetermined area of the electrode land being divided into at least two land regions by a solder resist, the solder resist having a prescribed width and a prescribed thickness disposed between the land regions on the surface of the predetermined area of the electrode land;
    supplying solder paste having a height larger than the thickness of the solder resist on each of the land regions; and
    providing the component electrode on the predetermined area of the electrode land, carrying out reflow heating, melting and then solidifying the solder paste while keeping a clearance to be left between the solder resist and the component electrode, thereby electrically and mechanically connecting the component electrode to each of the land regions.

9. The method of manufacturing the circuit board device according to claim 8, wherein the solder paste is supplied in such a quantity that the height of the solder paste after melting is higher than the thickness of the solder resist.

10. The method of manufacturing the circuit board device according to claim 8, wherein the solder soldering the component electrode to the predetermined area of the electrode land is disposed between the component electrode and each of the land regions.

11. The method of manufacturing the circuit board device according to claim 8, wherein solder soldering the component electrode is disposed solely below the component electrode.

12. The method of manufacturing the circuit board device according to claim 8, wherein the solder resist is extended from one peripheral portion of the predetermined area of the electrode land to another peripheral portion thereof.

13. The method of manufacturing the circuit board device according to claim 8, wherein the solder resist has a lattice pattern to form a plurality of the land regions in the predetermined area of the electrode land.

* * * * *